(12) United States Patent
Mauritzson et al.

(10) Patent No.: US 7,768,047 B2
(45) Date of Patent: Aug. 3, 2010

(54) IMAGER ELEMENT, DEVICE AND SYSTEM WITH RECESSED TRANSFER GATE

(75) Inventors: Richard A. Mauritzson, Meridian, ID (US); Inna Patrick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 11/746,730

(22) Filed: May 10, 2007

(65) Prior Publication Data
US 2008/0277693 A1    Nov. 13, 2008

(51) Int. Cl.
*H01L 31/062* (2006.01)
*H01L 31/113* (2006.01)
(52) U.S. Cl. ............ 257/292; 257/291; 257/E27.133
(58) Field of Classification Search ........... 257/291, 257/292, E27.133
See application file for complete search history.

(56) References Cited

U.S. PATENT DOCUMENTS

| 4,173,765 | A  | 11/1979 | Heald et al. |
| 6,140,630 | A  | 10/2000 | Rhodes |
| 6,204,524 | B1 | 3/2001  | Rhodes |
| 6,310,366 | B1 | 10/2001 | Rhodes et al. |
| 6,326,652 | B1 | 12/2001 | Rhodes |
| 6,333,205 | B1 | 12/2001 | Rhodes |
| 6,376,868 | B1 | 4/2002  | Rhodes |
| 6,780,732 | B2 | 8/2004  | Durcan et al. |
| 6,844,591 | B1 | 1/2005  | Tran |
| 7,009,227 | B2 | 3/2006  | Patrick et al. |
| 7,060,960 | B2* | 6/2006 | Ohta et al. ........ 250/214.1 |
| 7,091,059 | B2 | 8/2006  | Rhodes |
| 7,091,536 | B2 | 8/2006  | Rhodes et al. |
| 7,102,180 | B2 | 9/2006  | Rhodes et al. |
| 7,138,287 | B2* | 11/2006 | Mouli et al. ........... 438/48 |
| 7,187,018 | B2* | 3/2007  | Mouli et al. .......... 257/222 |
| 7,235,826 | B2* | 6/2007  | Ezaki et al. ......... 257/225 |
| 2004/0262609 | A1* | 12/2004 | Mouli et al. ........ 257/72 |
| 2005/0042793 | A1* | 2/2005 | Mouli et al. ......... 438/57 |
| 2005/0106820 | A1 | 5/2005 | Tran |
| 2006/0081887 | A1 | 4/2006 | Lyu |
| 2006/0124976 | A1 | 6/2006 | Adkisson et al. |
| 2006/0138486 | A1 | 6/2006 | Lim |
| 2006/0138493 | A1 | 6/2006 | Shim et al. |
| 2006/0197169 | A1 | 9/2006 | Cole |
| 2006/0214201 | A1 | 9/2006 | Rhodes |
| 2006/0216894 | A1 | 9/2006 | Parekh et al. |
| 2007/0034965 | A1* | 2/2007 | Jung et al. ............ 257/369 |
| 2007/0072333 | A1 | 3/2007 | Mouli et al. |
| 2007/0246746 | A1* | 10/2007 | Ezaki et al. ......... 257/233 |
| 2008/0083940 | A1* | 4/2008 | Ezaki et al. ......... 257/292 |

OTHER PUBLICATIONS

PCT International Search Report for Application No. PCT/US2008/062031 dated Oct. 29, 2008.

* cited by examiner

*Primary Examiner*—Ngan Ngo
(74) *Attorney, Agent, or Firm*—TraskBritt

(57) ABSTRACT

An imager element, device and imaging system image sensor pixel. The image sensor pixel includes a collection region, a floating diffusion region, and a transfer transistor having a recessed gate. The recessed gate is configured to couple the collection region to the floating diffusion region so that collected charge is transferred during activation. The recessed gate has an effective gate length greater than a physical gate length.

28 Claims, 5 Drawing Sheets

IMAGER ELEMENT, DEVICE AND SYSTEM WITH RECESSED TRANSFER GATE

FIELD OF THE INVENTION

The present invention relates generally to the field of semiconductor devices and more particularly, to a CMOS imager device having a transfer gate.

BACKGROUND OF THE INVENTION

The semiconductor industry currently uses different types of semiconductor-based imagers, including charge-coupled devices (CCD) and CMOS imager devices. Because of the inherent limitations in CCD technology, CMOS imagers have been increasingly used as low-cost imaging devices. A fully compatible CMOS sensor technology enabling a higher level of integration of an image array with associated processing circuits is beneficial for many digital applications.

A CMOS image sensor circuit includes a focal plane array of pixel cells, each one of the cells including a photoconversion device, for example, a photogate, photoconductor, or a photodiode for accumulating photo-generated charge in a doped portion of the substrate. A readout circuit is connected to each pixel cell and includes at least an output transistor, which receives photo-generated charges, typically from a doped floating diffusion region, and produces an output signal which is periodically read-out through an optional row select access transistor. The imager may optionally include a transistor for transferring charge from the photoconversion device to the floating diffusion region or the floating diffusion region may be directly connected to or part of he photoconversion device. A transistor is also conventionally provided for resetting the diffusion region to a predetermined charge level before it receives the photoconverted charges.

Exemplary CMOS imaging circuits, processing steps for fabrication thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the foregoing patents are hereby incorporated by reference herein in their entirety.

In a conventional CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of signals representing the reset state and a pixel charge signal. The photo-generated charge may be amplified when it moves from the initial charge accumulation region to the floating diffusion node through a transfer transistor. The charge at the floating diffusion node is converted to a pixel output voltage by a source follower output transistor.

As illustrated in FIG. 1, a known CMOS active pixel sensor (APS) 10 design used in many applications contains a photodiode 12 for producing charges which are gated by a transfer transistor 14 from the photodiode 12 for storage at a diffusion region 16. The transfer transistor 14 is illustrated as having an effective electrical length L for inhibiting current leakage of the photo-generated charge from the photodiode 12 to the diffusion region 16 when the transfer transistor 14 is inactive.

While CMOS sensors excel in photon-to-charge conversion under moderate lighting conditions, CMOS sensors suffer in low light conditions. CMOS sensor sensitivity to light is decreased because part of each pixel 18 is partially occupied with circuitry 20 other than the photodiode 12. The percentage of a pixel devoted to collecting light is called the pixel's "fill factor." While charge-coupled devices (CCDs) have nearly a 100% fill factor, CMOS sensors have much less. The lower the fill factor, the less sensitive the sensor becomes.

Another known problem with the conventional CMOS APS design is undesirable charge leakage that occurs between the photodiode and the diffusion region. As advances in resolution of imaging devices cause reductions in device dimensions, the charge leakage problem becomes even more pronounced. Furthermore, the charge leakage problem through the transfer transistor may not simply be addressed by proportionally increasing the area within the pixel that is allocated to the transfer transistor because the fill factor of the pixel is even further reduced.

There is a need, therefore, to have a CMOS sensor that exhibits reduced charge leakage between the photodiode and the floating diffusion region. There is also a need to have a transfer transistor that limits the amount of leakage between the photodiode and the diffusion region in a CMOS sensor while retaining an acceptable fill factor for the pixel.

DETAILED DESCRIPTION OF THE INVENTION

Figure 1:
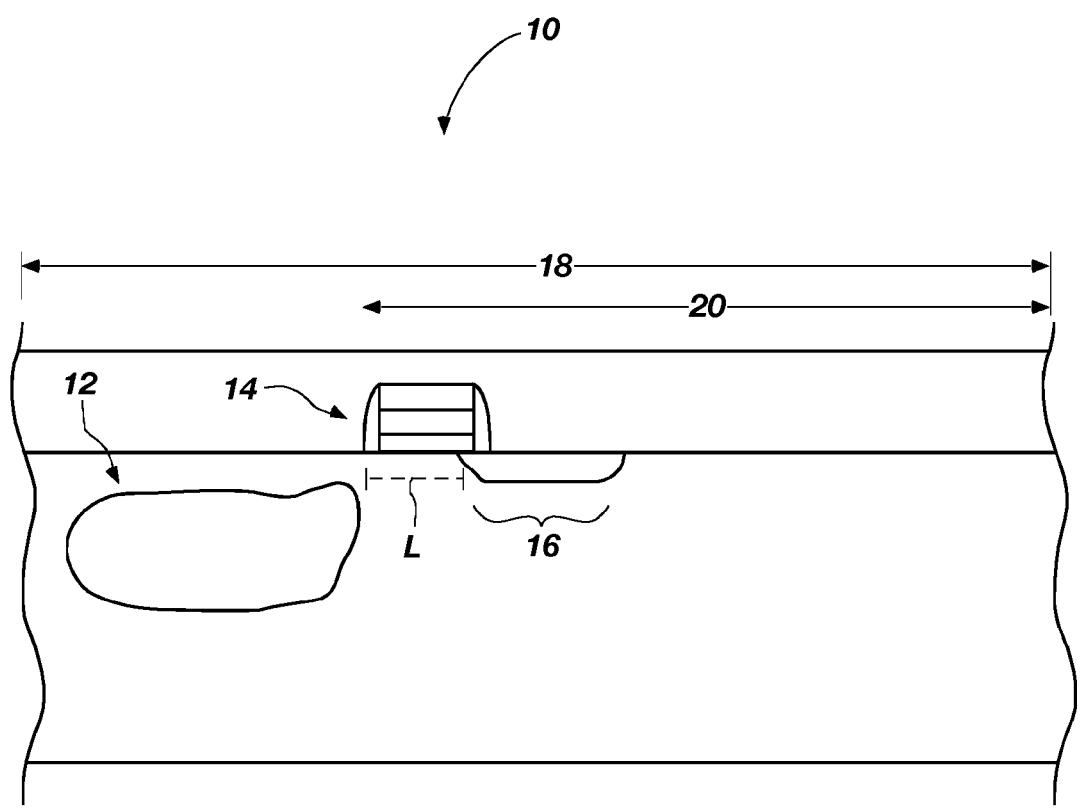
FIG. 1 is a sectional view of a portion of a conventionally formed CMOS image sensor pixel.

In the following detailed description, reference is made to the accompanying drawings which form a part hereof and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" In the following description, previous process steps may have been utilized to form regions or junctions in or over the base semiconductor structure or foundation. In addition, the semiconductor need not be silicon-based, but could be based on silicon-germanium, silicon-on-insulator, silicon-on-sapphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein.

A sensor pixel, an image sensor element, an imaging device and an electronic imager system with a recessed transfer gate are disclosed, as is a method of fabricating an imager sensor pixel. In one embodiment of the present invention, an image sensor pixel includes a collection region and a floating diffusion region. The image sensor pixel further includes a transfer transistor including a recessed gate configured for coupling the collection region to the floating diffusion region for transferring collected charge when activated.

In another embodiment of the present invention, an image sensor element includes a transfer transistor including a first source/drain region including a charge collection region for collecting charge generated by light. The transfer transistor further includes a second source/drain region including a floating diffusion region. A gate is configured for coupling the collection region to the floating diffusion region to transfer the collected charge when the recessed gate is activated. The transfer transistor further includes a gate configured to include a longer effective gate length than the physical gate length.

In a further embodiment of the present invention, an imaging device includes a plurality of charge collection regions supported by a substrate and a corresponding plurality of floating diffusion regions. The imaging device further includes a corresponding plurality of transfer transistors including a corresponding plurality of recessed gates for transferring stored charge from the plurality of charge collection regions to the plurality of floating diffusion regions.

In yet another embodiment of the present invention, an electronic imager system includes an imaging device and at least one input/output device. The imaging device includes a plurality of image sensor pixels each including a recessed transfer gate for transferring stored charge from a plurality of charge collection regions to a plurality of floating diffusion regions in the plurality of image sensor pixels.

In a yet further embodiment of the present invention, a method of forming an imager sensor pixel is described. The method includes forming a collection region and forming a floating diffusion region. The method further includes forming a transfer transistor including a recessed gate configured for coupling the collection region to the floating diffusion region to transfer collected charge when activated.

Figure 2:
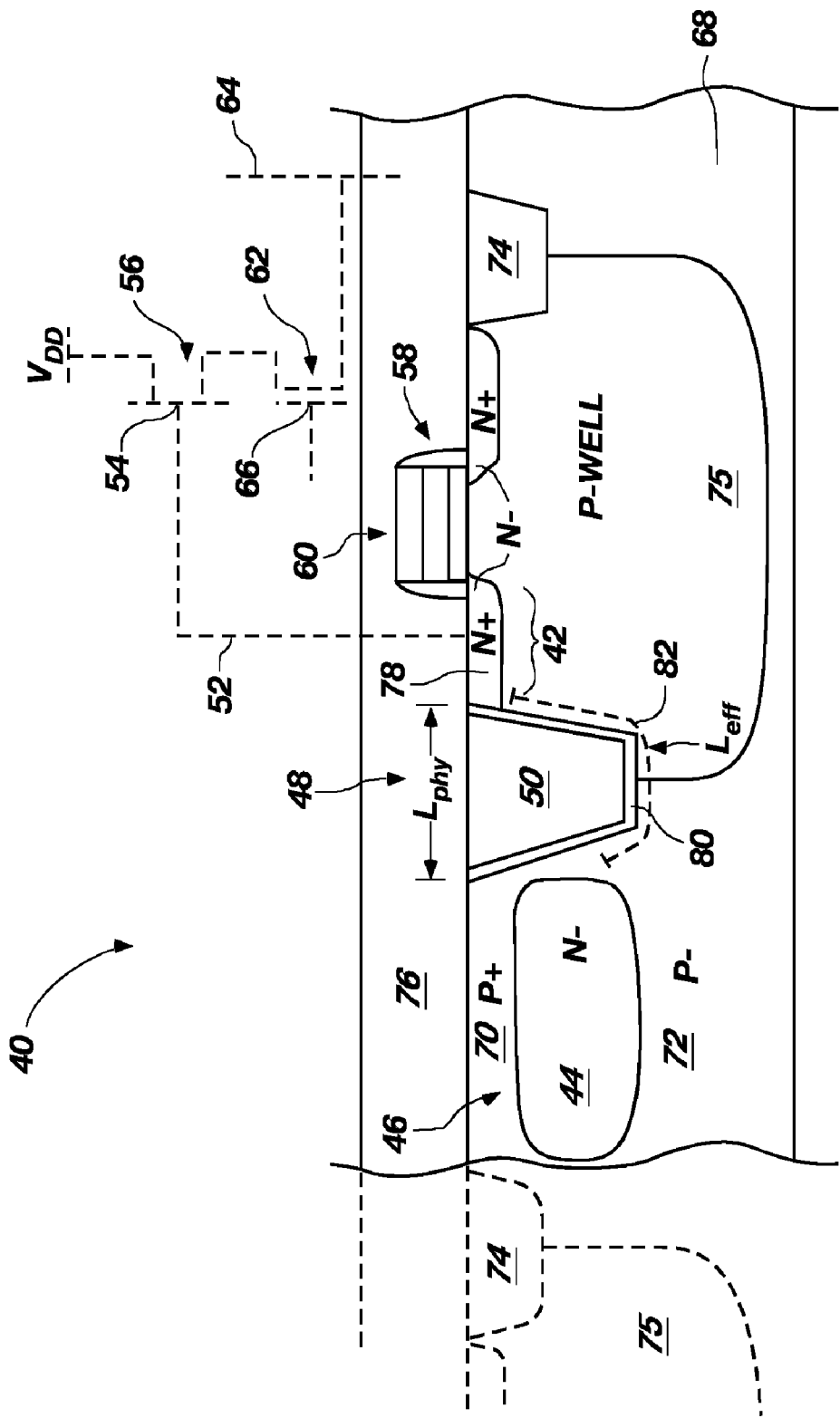
FIG. 2 is a sectional view of a portion of a CMOS image sensor pixel, in accordance with an embodiment of the present invention.

FIG. 2 illustrates a sectional view of a portion of a CMOS image sensor pixel 40 employing an n-type doped floating diffusion region 42. The CMOS image sensor pixel 40 generally comprises a charge collection region 44 of a photodiode 46 for collecting charges generated by light incident on the pixel, and a transfer transistor 48 having a recessed gate 50 for transferring photoelectric charges from the charge collection region 44 to the floating diffusion region 42. The floating diffusion region 42 is electrically connected via conductor 52 to a gate 54 of an output source follower transistor 56. The pixel 40 also includes a reset transistor 58 having a gate 60 for resetting the floating diffusion region 42 to a predetermined voltage before charge is transferred thereto from the photodiode 46. During the reading of a pixel, a source follower transistor 56 receives at the gate 54 an electrical signal from the floating diffusion region 42 and a row select transistor 62 selectively outputs a signal from the source follower transistor 56 to a column line 64 in response to a decoded row address driver signal applied to a gate 66 of the transistor 62.

By way of example and not limitation, the pixel 40 of FIG. 2 employs a pinned photodiode 46 having charge collection region 44 for converting photons to electrical charge on a semiconductor substrate 68. The depicted pinned photodiode 46 is termed such since the potential in the photodiode 46 is pinned to a constant value when the photodiode 46 is fully depleted. The pinned photodiode 46 has a photosensitive p-n junction region comprising a p+ type region 70 and an n-type photodiode charge collection region 44 within a p-type region 72. The p-type region 72 is formed within semiconductor substrate 68. The p+ region 70 and the p-type region 72 cause the n-type photodiode charge collection region 44 to be fully depleted at a pinning voltage. Impurity doped source/drain regions having n-type conductivity are provided about the transistor gates 50 and 60. The floating diffusion region 42 adjacent to transfer transistor 48 and reset transistor 58 is a common source/drain region for the transfer transistor 48 having recessed gate 50 and the reset transistor 58 having gate 60.

In a conventional CMOS image sensor, trench isolation regions 74 formed in a p-well active layer 75 and adjacent to the charge collection region 44 are used to isolate the pixels 40. The stacked configuration of gate 60 for the reset transistor 58 may be formed before or after the trench isolation regions 74 are formed. The order of these preliminary process steps may be varied as is required for convenience or for a particular process flow.

A transparent insulating layer 76 is conventionally formed over the pixel 40. Conventional processing methods are then carried out to form, for example, metal conductor 52 in the insulating layer to provide an electrical connection/contact to the floating diffusion region 42, and other wiring to connect gate lines and other connections in pixel 40. For example, the entire surface of substrate 68 may be covered with a passivation layer of e.g., silicon dioxide, BSG, PSG, or BPSG, as a transparent insulating layer 76, which is planarized and etched to provide contact holes, which are then metalized to provide contacts to a diffusion node 78.

In conventional CMOS image sensors, electrons are generated from light incident externally and accumulate in the n-type photodiode charge collection region 44. These charges are transferred to the floating diffusion region 42 by the recessed gate 50 of the transfer transistor 48. The source follower transistor 56 produces an output signal from the transferred charges.

During reading of the pixel, a maximum output signal is proportional to the number of electrons extracted from the n-type photodiode charge collection region 44. The maximum output signal increases with increased electron capacitance or acceptability of the photodiode. The electron capacity of pinned photodiodes typically depends on doping levels and the dopants implanted to form regions 70, 72, and 44. In particular, regions 70 and 44 dominate the capacitance of pinned photodiode 46. Accordingly, increasing the capacitance of pinned photodiode 46 is useful to allow capture of greater levels of photoconverted charges.

The use of a recessed gate 50 for transfer transistor 48 results in an increased effective gate length $L_{eff}$ while reduction in the physical gate length $L_{phy}$. An increase in the effective gate length $L_{eff}$ of recessed gate 50 results in reduced charge leakage between the photodiode 46 and the floating diffusion region 42 when the transfer transistor 48 is in the off-state. Furthermore, the reduction in the physical gate length $L_{phy}$ of recessed gate 50 results in the ability to either increase the fill factor of the pixel 40 by increasing the size of the photodiode 46 or decreasing the overall size of the pixel 40 to accommodate greater density or reduction in overall sensor array dimensions.

Transfer transistor 48 is constructed within the semiconductor substrate 68 and includes recessed gate 50 extending within the substrate 68. A dielectric material 80 is formed between the recessed gate 50 and the substrate 68 with the transistor's source/drain regions including the charge collection region 44 and the floating diffusion region 42. When activated, a channel region 82 having an effective length of $L_{eff}$ extends around a lowermost portion of the recessed gate 50 and interconnects the charge collection region 44 and the floating diffusion region 42 with one another.

A benefit of using a recessed gate as opposed to a non-recessed gate is the effective lengthening of the channel region 82 of the transfer transistor 48 as a result of the channel extending around a recessed portion of the recessed gate 50. Such an effective lengthening of the channel region 82 reduces short-channel effects for the transfer transistor 48 as well as provides for an improved connection between the charge collection region 44 and transfer transistor 48 without requiring a significant angular implant for the formation of the charge collection region 44. Exemplary processing steps for the formation of recessed gates are described, for example, in U.S. Pat. No. 6,844,591 to Tran, the disclosure of the foregoing patent being hereby incorporated by reference herein in its entirety.

Figure 3:
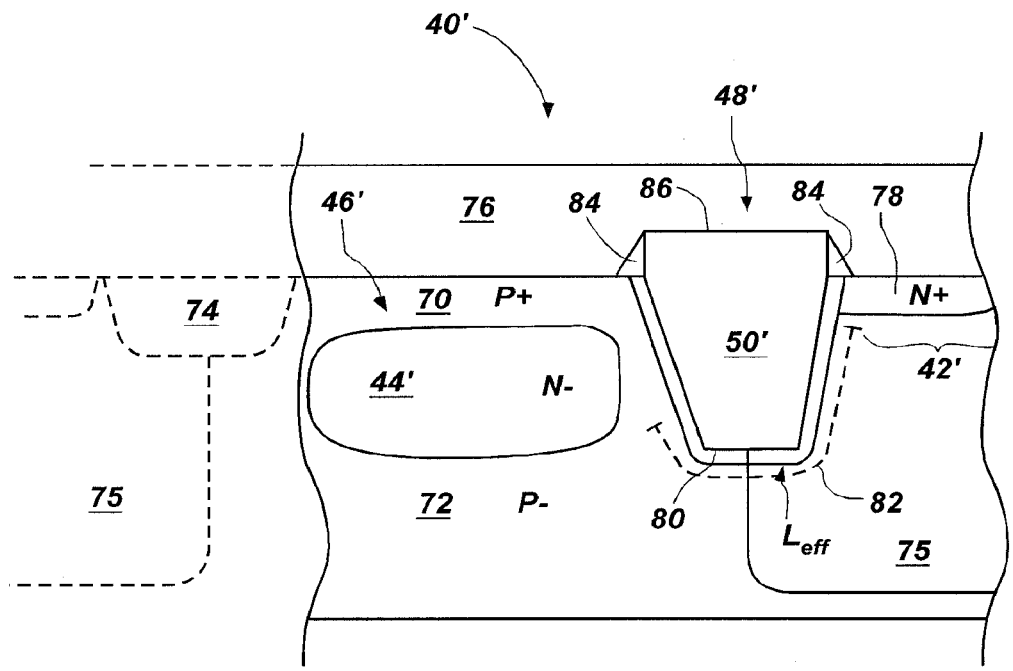
FIG. 3 is a sectional view of a portion of a CMOS image sensor pixel, in accordance with another embodiment of the present invention.

FIG. 3 illustrates a sectional view of a portion of a CMOS image sensor pixel 40', in accordance with another embodiment of the present invention. One of the challenges in fabricating integrated circuits is the proper alignment of the various levels of a structure to facilitate proper operation. One critical alignment occurs between gate areas and their corresponding source/drain regions. In the present embodiment of the invention, the illustrated portion of pixel 40' includes a transfer transistor 48' comprising a recessed gate 50'.

Recessed gate 50' includes an extended portion 86 that extends above an upper surface to enable the formation of spacers 84 about the extended portion 86 of recessed gate 50'. Spacers 84 enable a self-alignment process for the formation of a photodiode 46' and a floating diffusion region 42' in the source/drain regions of transfer transistor 48'. The dimensions of spacers 84 may be adjusted according to specific processes to reduce the need for angled implantation of the charge collection region 44' as required in the formation of conventional collection regions adjacent to non-recessed gates. Other structures of pixel 40' including the reset transistor, the source follower transistor, trench isolation regions and the transparent insulating layer may be formed as described hereinabove.

Figure 4:
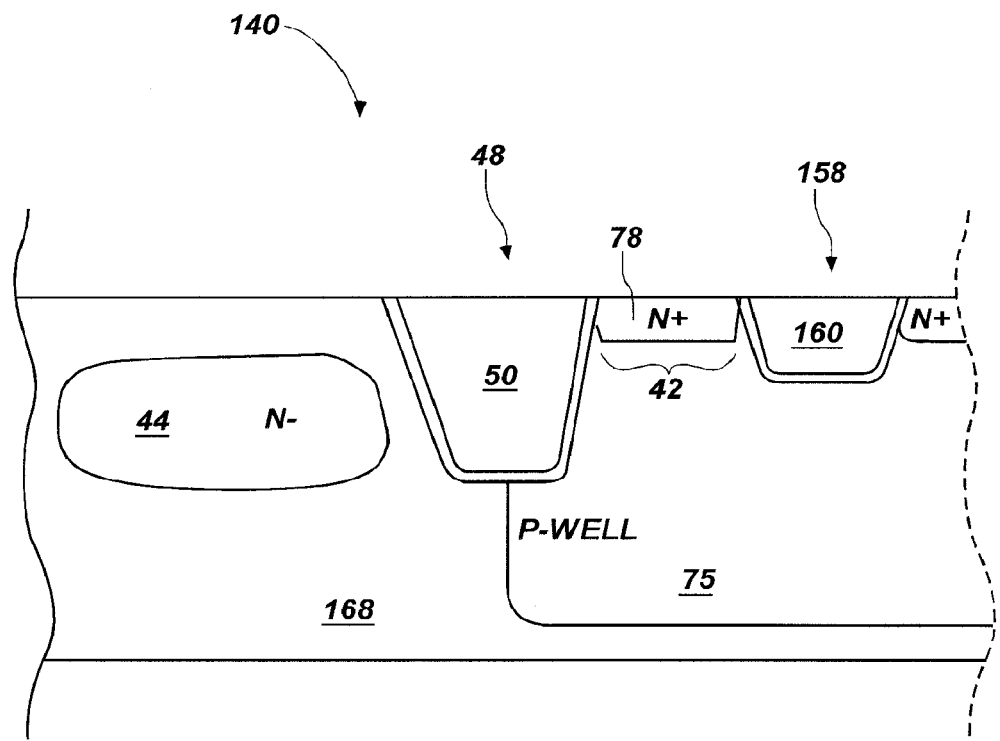
FIG. 4 is a sectional view of a portion of a CMOS image sensor pixel, in accordance with yet another embodiment of the present invention.

FIG. 4 is a sectional view of a portion of a CMOS image sensor pixel 140, in accordance with another embodiment of the present invention. As described above with reference to FIG. 2, a CMOS image sensor pixel includes a reset transistor having a gate for resetting the floating diffusion region to a predetermined voltage before charge is transferred thereto from the photodiode. As fabrication processes utilize specific steps for forming the various devices, the present embodiment reuses existing processing steps for the formation of other similar devices.

Specifically in FIG. 4, the portion of CMOS image sensor pixel 140 utilizes existing processes for forming a transfer transistor 48 having a recessed gate 50 for the formation of a reset transistor 158 also having a recessed gate 160 which is formed using similar steps as those used to form the recessed gate transfer transistor in substrate 168. When activated, the transfer transistor 48, having a recessed gate 50, transfers photoelectric charges from the charge collection region 44 to the floating diffusion region 42. A diffusion node 78 provides a contact into the floating diffusion region 42 for sensing the transferred charge. Thereafter, reset transistor 158 having recessed gate 160 resets the floating diffusion region 42 to a predetermined voltage before a subsequent transfer of charge from the charge collection region 44.

Figure 5:
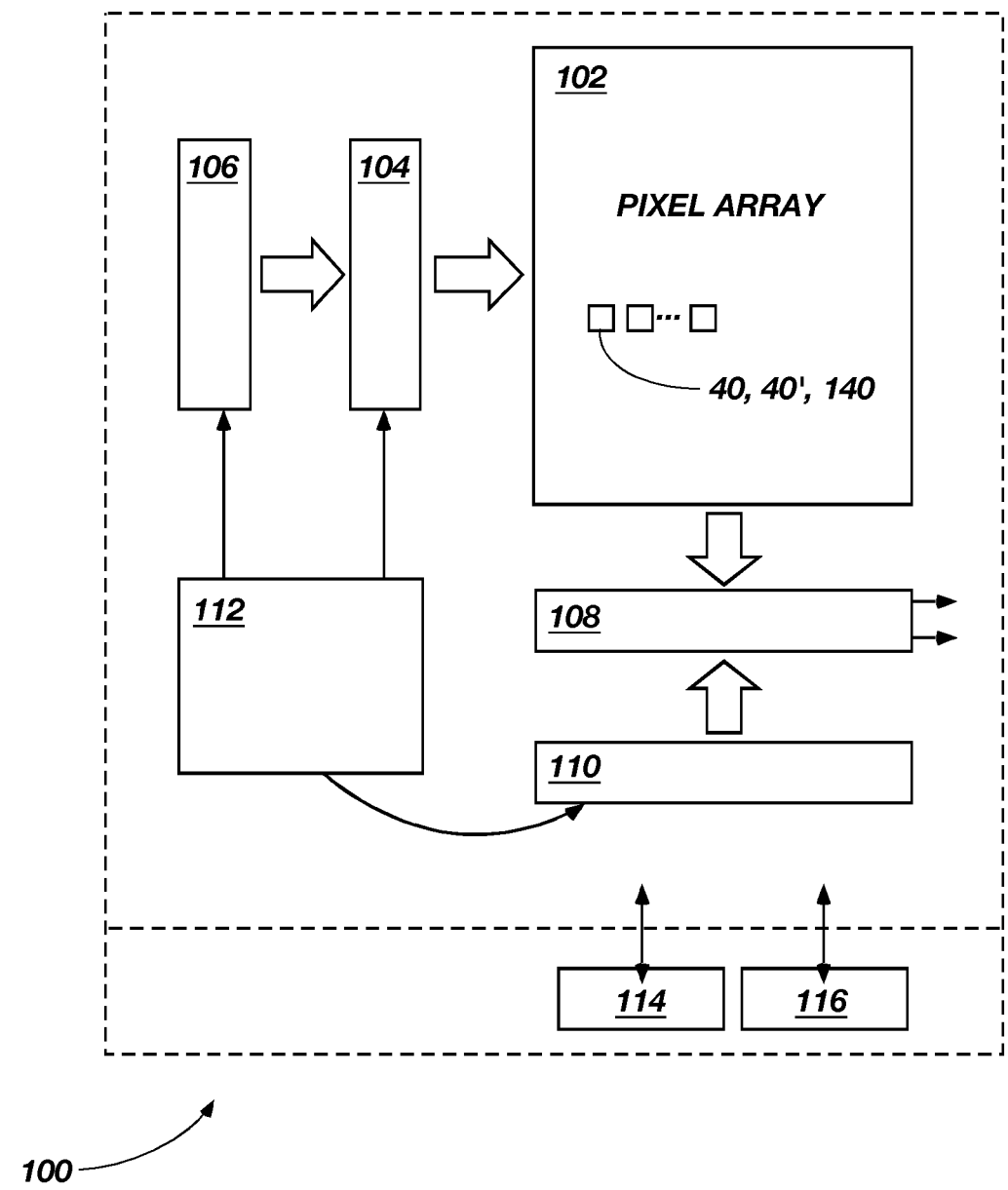
FIG. 5 is a block diagram of an imaging device including an array of image sensor pixels, in accordance with an embodiment of the present invention.

FIG. 5 illustrates a block diagram for a CMOS imaging device 100 having a pixel array 102 incorporating pixels 40, 40', 140, constructed in the manner discussed above in relation to FIGS. 2-4. Pixel array 102 features a plurality of pixels arranged in columns and rows. The pixels of each row in pixel array 102 can all be turned on at the same time by a row select line and the pixels of each column are selectively output by a column select line. A plurality of row and column lines is provided for the entire pixel array 102. The row lines are selectively activated by a row driver 104 in response to a row address decoder 106 and the column select lines are selectively activated by a column driver 108 in response to a column address decoder 10. Thus, a row and column address is provided for each pixel.

The CMOS imaging device 100 is operated by a control circuit 112 which controls the row and column address decoders 106, 110 for selecting the appropriate row and column lines for pixel readout, and the row and column drivers 104, 108 which apply driving voltage to the drive transistors of the selected row and column lines. A memory 114, e.g., a Flash memory or an SRAM, can be in communication with the pixel array 102 and control circuit 112. A parallel-to-serial converter 116 can be in communication with the control circuit 112.

Typically, the signal flow in the CMOS imaging device 100 would begin at the pixel array 102 upon receiving photo-input and generating a charge. The signal is output to a read-out circuit and then to an analog-to-digital conversion device. The digitized signal is transferred to a processor, then the parallel-to-serial converter 116, and the serialized signal can be output from the imaging device to external hardware.

Figure 6:
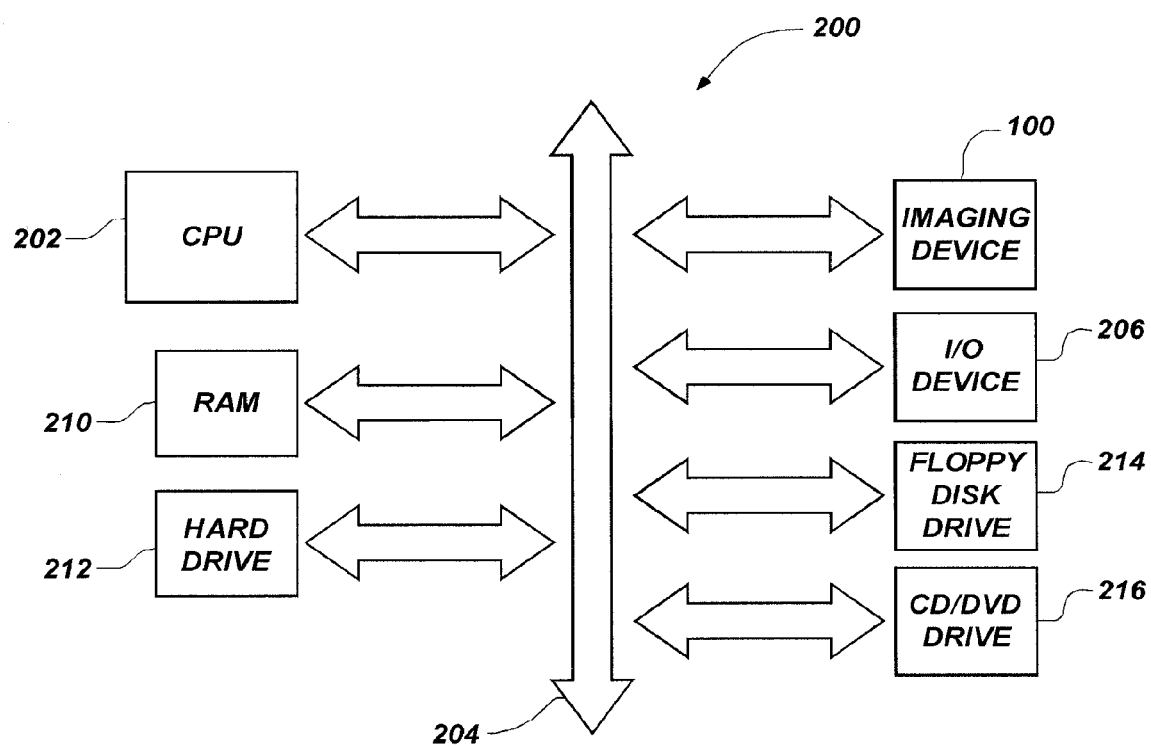
FIG. 6 is a system diagram of an electronic system including an imaging device, in accordance with an embodiment of the present invention.

FIG. 6 illustrates an electronic imager system, in accordance with an embodiment of the present invention. An electronic imager system 200 includes an imaging device 100, illustrated in FIG. 5, as an input device to the electronic imager system 200. The imaging device 100 may also receive control or other data from electronic imager system 200. Examples of processor based systems, which may employ the imaging device 100, include, without limitation, computer systems, camera systems, scanners, machine vision systems, vehicle navigation systems, video telephones, surveillance systems, auto focus systems, star tracker systems, motion detection systems, image stabilization systems, and others.

An electronic imager system 200 includes a central processing unit (CPU) 202 that communicates with various devices over a bus 204. Some of the devices connected to the bus 204 provide communication into and out of the electronic imager system 200, illustratively including an input/output (I/O) device 206 and imaging device 100. Other devices connected to the bus 204 provide memory, illustratively including a random access memory (RAM) 210, a hard drive 212, and one or more removable memory devices, such as a floppy disk drive 214, compact disk (CD) or digital video disk (DVD) drive 216, Flash memory cards, etc. The imaging device 100 may be combined with a processor, such as a CPU, digital signal processor, or microprocessor, in a single integrated circuit.

The processes and devices described above illustrate exemplary methods and devices out of many that may be used and produced according to the present invention. The above description and drawings illustrate embodiments which provide significant features and advantages of the present invention. It is not intended, however, that the present invention be strictly limited to the above-described and illustrated embodiments.

Although the present invention has been shown and described with reference to particular embodiments, various additions, deletions and modifications that will be apparent to a person of ordinary skill in the art to which the invention pertains, even if not shown or specifically described herein, are deemed to lie within the scope of the invention as encompassed by the following claims.

What is claimed is:

1. An image sensor pixel, comprising:
   a collection region;
   a floating diffusion region; and
   a transfer transistor including a recessed gate extending into a substrate to substantially at least a depth of a lower edge of the collection region, physically isolated from the collection region by a portion of a substrate and configured for coupling the collection region to the floating diffusion region to transfer collected charge when activated.

2. The image sensor pixel of claim 1, wherein the collection region and the floating diffusion region form source/drain regions of the transfer transistor.

3. The image sensor pixel of claim 1, further comprising a photodiode including the collection region.

4. The image sensor pixel of claim 3, wherein the photodiode is a pinned photodiode.

5. The image sensor pixel of claim 3, wherein the photodiode includes a photosensitive p-n junction region comprising a p+ type region and a p-type region, and wherein the collection region is an n-type charge collection region within the p-type region.

6. The image sensor pixel of claim 1, wherein the recessed gate has an effective gate length that is longer than a physical gate length.

7. The image sensor pixel of claim 1, further comprising alignment spacers located adjacent to a portion of the recessed gate and configured to provide alignment for implanting the collection region.

8. The image sensor pixel of claim 1, further comprising a reset transistor configured to reset the floating diffusion region to a predetermined voltage before the collected charge is transferred from the collection region to the floating diffusion region.

9. The image sensor pixel of claim 8, wherein the reset transistor is configured as a stacked gate transistor.

10. The image sensor pixel of claim 8, wherein the reset transistor is configured as a recessed gate transistor.

11. An image sensor element comprising a transfer transistor, including:
    a first source/drain region including a charge collection region for collecting charge generated by light;
    a second source/drain region including a floating diffusion region; and
    a recessed gate extending into a substrate to substantially at least a depth of a lower edge of the charge collection region, spaced from the charge collection region having a portion of the substrate therebetween and configured for coupling the collection region to the floating diffusion region to transfer the collected charge when the gate is activated, the gate further including a longer effective gate length than a physical gate length.

12. The image sensor element of claim 11, wherein the gate is configured as a recessed gate.

13. The image sensor element of claim 12, wherein the recessed gate includes an extended portion configured to extend above the charge collection region.

14. The image sensor element of claim 13, further comprising at least one spacer formed to a side of the extended portion of the recessed gate to provide an implant alignment when forming the charge collection region.

15. The image sensor element of claim 11, wherein the charge collection region is configured as a photodiode.

16. The image sensor element of claim 11, further comprising a reset transistor to set the floating diffusion region to a set voltage prior to activation of the gate.

17. The image sensor element of claim 16, wherein a gate of the reset transistor is configured as a recessed gate.

18. An imaging device, comprising:
    a plurality of charge collection regions supported by a substrate;
    a corresponding plurality of floating diffusion regions; and
    a further corresponding plurality of transfer transistors including a corresponding plurality of recessed gates, each recessed gate of the plurality of recessed gates extending into the substrate to substantially at least a depth of a lower edge of an associated charge collection region of the plurality of charge collection regions and configured for transferring stored charge from the associated charge collection region of the plurality of charge collection regions to an associated floating diffusion region of the plurality of floating diffusion regions, wherein each charge collection region of the plurality of charge collection regions is physically isolated from a corresponding recessed gate of the plurality of recessed gates by a portion of the substrate.

19. The imaging device of claim 18, wherein the pluralities of charge collection regions, floating diffusion regions and transfer transistors are configured in an array.

20. The imaging device of claim 18, wherein the plurality of charge collection regions form a part of a corresponding plurality of photodiodes.

21. The imaging device of claim 18, wherein each of the plurality of recessed gates is configured to have an effective gate length that is longer than a physical gate length.

22. The imaging device of claim 18, wherein each of the plurality of recessed gates is configured for self-aligning a formation of the corresponding plurality of charge collection regions.

23. The imaging device of claim 18, further comprising a corresponding plurality of reset transistors coupled to the plurality of floating diffusion regions to selectively set each of the plurality of floating diffusion regions to a set voltage prior to activation of the corresponding plurality of recessed gates.

24. The imaging device of claim 23, wherein each of the plurality of reset transistors are configured as recessed gate transistors.

25. An electronic imager system, comprising:
    at least one input/output device; and
    an imaging device including a plurality of image sensor pixels, each image sensor pixel of the plurality including a recessed transfer gate extending into a substrate to substantially at least a depth of a lower edge of a charge collection region and configured for transferring stored charge from the charge collection region to a floating diffusion region in the image sensor pixel of the plurality, wherein a portion of the substrate is positioned between the charge collection region and the recessed transfer gate.

26. The electronic imager system of claim 25, wherein the recessed transfer gate is configured for self-aligning implantation of the corresponding charge collection region.

27. The electronic imager system of claim 25, wherein the image sensor pixel of the plurality further comprises a corresponding reset transistor configured with a recessed gate.

28. The electronic imager system of claim 25, further comprising a processor operably coupled to the at least one input/output device and to the imager device.

* * * * *